(12) United States Patent
Ikeda et al.

(10) Patent No.: US 9,702,913 B2
(45) Date of Patent: Jul. 11, 2017

(54) ACQUISITION METHOD FOR S-PARAMETERS IN MICROWAVE INTRODUCTION MODULES, AND MALFUNCTION DETECTION METHOD

(71) Applicant: TOKYO ELECTRON LIMITED, Tokyo (JP)

(72) Inventors: Taro Ikeda, Nirasaki (JP); Yutaka Fujino, Nirasaki (JP); Hikaru Adachi, Nirasaki (JP); Hiroyuki Miyashita, Nirasaki (JP); Yuki Osada, Nirasaki (JP); Nobuhiko Yamamoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 200 days.

(21) Appl. No.: 14/413,170

(22) PCT Filed: Jun. 11, 2013

(86) PCT No.: PCT/JP2013/066016
§ 371 (c)(1),
(2) Date: Jan. 6, 2015

(87) PCT Pub. No.: WO2014/010356
PCT Pub. Date: Jan. 16, 2014

(65) Prior Publication Data
US 2015/0212127 A1     Jul. 30, 2015

(30) Foreign Application Priority Data

Jul. 9, 2012  (JP) ................................ 2012-153902

(51) Int. Cl.
*G01R 31/02*     (2006.01)
*C23F 1/00*      (2006.01)
(Continued)

(52) U.S. Cl.
CPC ............. *G01R 27/06* (2013.01); *G01R 27/28* (2013.01); *H01J 37/321* (2013.01);
(Continued)

(58) Field of Classification Search
CPC ... G01R 27/06; G01R 27/28; H01J 37/32192; H01J 37/321; H01J 37/32926; H05H 1/46; H05H 2001/4682; H05H 2001/463
(Continued)

(56) References Cited

U.S. PATENT DOCUMENTS 7,061,254 B1    6/2006  Shoulders et al.
2008/0236489 A1  10/2008  Kotani
(Continued)

FOREIGN PATENT DOCUMENTS

JP   2002-305182 A   10/2002
JP   2004-119179 A   4/2004
(Continued)

OTHER PUBLICATIONS

International Search Report issued in PCT/JP2013/066016 dated Sep. 17, 2013 (Sep. 17, 2013), 2 pages.

*Primary Examiner* — Farhana Hoque
(74) *Attorney, Agent, or Firm* — Nath, Goldberg & Meyer; Jerald L. Meyer

(57) ABSTRACT

A plasma processing apparatus (1) includes a processing container (2) and a microwave introduction device (5) having a plurality of microwave introduction modules (61). A microwave is introduced for each of the plurality of microwave introduction modules (61), and S-parameters for each of combinations of the plurality of microwave introduction modules (61) are obtained based on the introduced microwave and a reflected microwave reflected from the processing container (2) into the plurality of microwave introduction modules (61).

12 Claims, 9 Drawing Sheets

(51) Int. Cl.
*G01R 27/06* (2006.01)
*H05H 1/46* (2006.01)
*H01J 37/32* (2006.01)
*G01R 27/28* (2006.01)

(52) U.S. Cl.
CPC .. *H01J 37/32192* (2013.01); *H01J 37/32926* (2013.01); *H05H 1/46* (2013.01); *H05H 2001/463* (2013.01); *H05H 2001/4682* (2013.01)

(58) Field of Classification Search
USPC .................. 324/537; 156/345.28, 345.41
See application file for complete search history.

(56) References Cited

U.S. PATENT DOCUMENTS

| | | | | |
|---|---|---|---|---|
| 2011/0018651 A1* | 1/2011 | Ikeda | ................ | H01J 37/32192 333/118 |
| 2011/0061814 A1* | 3/2011 | Ikeda | ................ | H01J 37/32192 156/345.41 |

FOREIGN PATENT DOCUMENTS

| | | |
|---|---|---|
| JP | 2006-317448 A | 11/2006 |
| JP | 2012-089334 A | 5/2012 |

\* cited by examiner

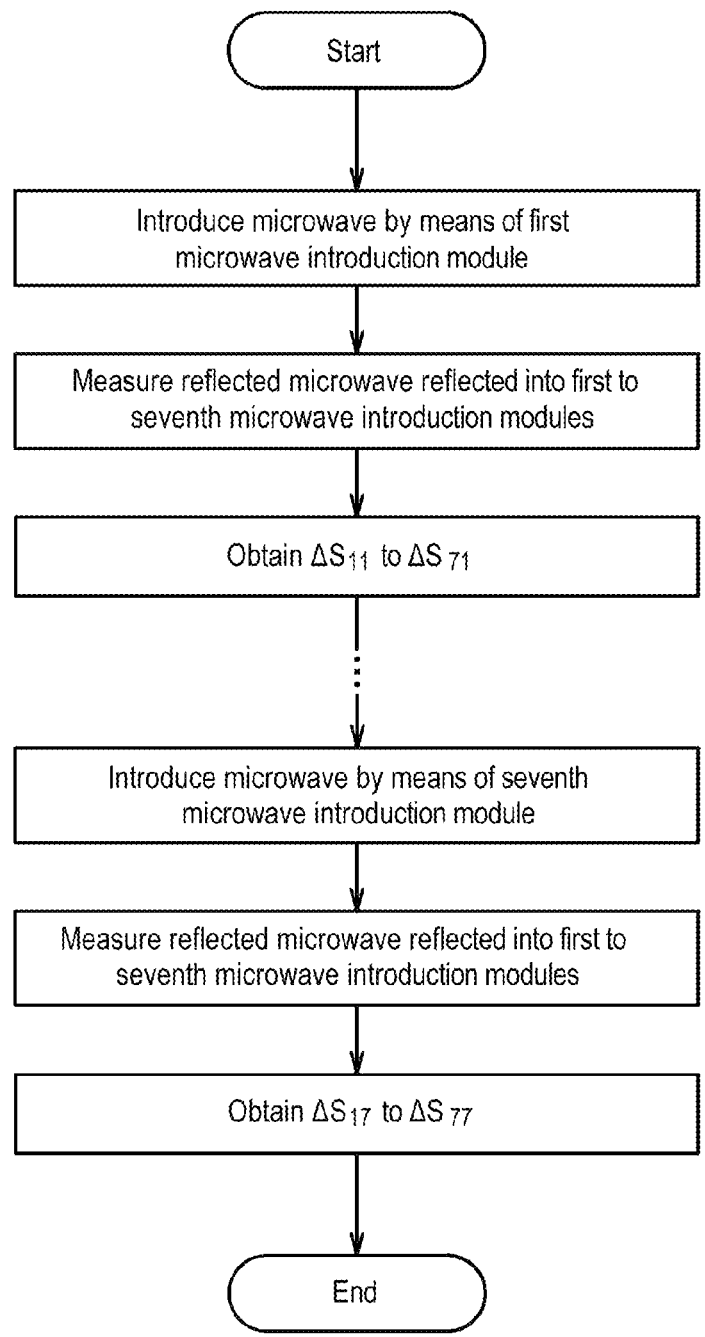

ACQUISITION METHOD FOR S-PARAMETERS IN MICROWAVE INTRODUCTION MODULES, AND MALFUNCTION DETECTION METHOD

TECHNICAL FIELD

The present disclosure relates to a method for acquiring S-parameters in a plasma processing apparatus including a microwave introduction device having a plurality of microwave introduction modules, and a malfunction detection method.

BACKGROUND

As one type of plasma processing apparatus for subjecting workpieces, such as semiconductor wafers and the like, to plasma processing, there has been known a slot antenna-type plasma processing apparatus for generating plasma by introducing a microwave into a processing container using a planar antenna having a plurality of slots. As another plasma processing apparatus, there has been known an ICP (Inductively Coupled Plasma)-type plasma processing apparatus for generating plasma by introducing a high frequency into a processing container using a coil shaped antenna. These plasma processing apparatuses can generate dense plasma in the processing container, and oxidation, nitridation, deposition, etching and so on may be performed by the generated plasma.

For the purpose of developing next-generation devices, in order to improve productivity while coping with 3D device processing and miniaturization, there is a need to enlarge a wafer currently having a diameter of 300 mm into a wafer having a diameter of 450 mm while securing uniformity of processing in a wafer plane. Therefore, there is a need to uniformalize distribution (density distribution) of plasma in a processing container to be enlarged in response to the enlarged wafer.

In the slot antenna-type microwave plasma processing apparatus, the plasma distribution is controlled based on the shape and arrangement of slots, design of shapes of a processing container and a microwave introduction window, and so on. For example, in order to change the plasma distribution based on content of processing, there is a need to use a planar antenna having different slot shapes and arrangements which are optimally adjusted. In addition, in the above-mentioned ICP-type plasma processing apparatus, in order to change the plasma distribution, there is a need to employ an antenna having different coil shapes and arrangements which are optimally adjusted. However, such antenna replacement is a big operation which requires much time and effort such as redesign and the like.

In addition, the plasma distribution can be adjusted to an optimal plasma environment by changing process parameters such as microwave power, processing pressure, gas flow rate and the like. However, since these process parameters cannot be separated from process conditions, a width (margin) of change of the plasma distribution within a range of which the process parameters can be changed is small, thereby limiting its effects.

In addition, due to various factors such as manufacturing tolerances and assembly errors of a planar antenna, a processing container and the like, variations between devices having the same specification, and so on, symmetry of plasma in the processing container may be collapsed and the plasma distribution may be eccentric. In this case, since there is no means for correcting this in a simple method, there are difficulties in large-scaled device modification such as replacement of the planar antenna.

Therefore, in order to make the plasma distribution in the processing container more uniform, a plasma processing apparatus for introducing a microwave into different locations in the processing container and controlling a distribution of multiple plasmas generated by the microwave may be considered. In such a plasma processing apparatus, it is required to install a plurality of (for example, 7) microwave introduction modules for introducing the microwave into the processing container.

However, in the plasma processing apparatus, there is a need to detect various malfunctions occurring after the start of operation. Patent Document 1 (JP 2002-305182 A) discloses a method of determining a malfunction of a plasma status by monitoring a voltage applied to a lower electrode in a plasma processing apparatus for supplying power to the lower electrode installed in a vacuum chamber for plasma generation. Patent Document 2 (JP 2004-119179 A) discloses a method of checking a malfunction of a plasma processing apparatus by monitoring a voltage or the like on a power feed circuit in the plasma processing apparatus in which power is supplied from two high frequency power supplies having different output frequencies.

In addition, like the plasma processing apparatus in which a plurality of microwave introduction modules is installed, in the case of an apparatus in which a plurality of incident waves and reflected waves exist, it can be considered that S-parameters indicating a relationship between the plurality of incident waves and the plurality of reflected waves are used as parameters indicating the state of this apparatus. Patent Document 3 (JP 2006-317448 A) discloses that two-port S-parameter calibration is performed in power calibration of a vector network analyzer.

In the plasma processing apparatus in which a plurality of microwave introduction modules is installed, there is a need to introduce a microwave with a good balance between the plurality of microwave introduction modules. However, if a malfunction occurs in one or more of the microwave introduction modules, the balance between the plurality of microwave introduction modules is collapsed, which may result in abnormal plasma processing. Therefore, there is a need to detect a malfunction in microwave introduction modules which collapses the balance between the plurality of microwave introduction modules in such a plasma processing apparatus.

SUMMARY

The present disclosure provides some embodiments of a method for acquiring S-parameters in a plasma processing apparatus provided with a plurality of microwave introduction modules and a method for detecting a malfunction in the microwave introduction modules.

According to one embodiment of the present disclosure, there is provided a method for acquiring S-parameters of microwave introduction modules in a plasma processing apparatus including a processing container in which a workpiece is accommodated, a microwave introduction device including a plurality of microwave introduction modules configured to introduce a microwave into the processing container for generating plasma in the processing container, and an exhauster configured to evacuate the interior of the processing container in a pressure reducing manner. The plurality of microwave introduction modules is configured to introduce the microwave into different locations in the processing container.

The S-parameter acquisition method of the present disclosure includes putting the interior of the processing container in a vacuum state and a state that no plasma is generated, and inducing the microwave from each of the plurality of microwave introduction modules. S-parameters for each of combinations of two selected from the plurality of microwave introduction modules are obtained based on the introduced microwave and a reflected microwave that is reflected from the processing container into the plurality of microwave introduction modules.

In the S-parameter acquisition method of the present disclosure, each of the plurality of microwave introduction modules may include a power meter configured to measure power of the microwave and power of the reflected microwave. In this case, S-parameters for each of the combinations of two selected from the plurality of microwave introduction modules may be obtained using the power of the microwave and the power of the reflected microwave. In this case, the microwave may include a plurality of incident waves having different power for each of the plurality of microwave introduction modules, and the reflected microwave may include a plurality of reflected waves corresponding respectively to the plurality of incident waves. The S-parameters for each of the combinations of two selected from the plurality of microwave introduction modules may be obtained from power of the plurality of incident waves and power of the plurality of reflected waves using the least-squares method.

In addition, in the S-parameter acquisition method of the present disclosure, the microwave introduction device may include first to seventh microwave introduction modules as the plurality of microwave introduction modules. In addition, in the S-parameter acquisition method of the present disclosure, the processing container may include a ceiling portion having first to seventh microwave introduction ports configured to pass the microwave introduced by means of the first to seventh microwave introduction modules into the interior of the processing container. In this case, the first microwave introduction port may be located in the center of the ceiling portion. In addition, the second to seventh microwave introduction ports may be respectively located at vertices of a virtual regular hexagon centered at the first microwave introduction port in the ceiling portion.

In addition, in the S-parameter acquisition method of the present disclosure, when the microwave introduction device includes the first to seventh microwave introduction modules, the combination of two selected from the plurality of microwave introduction modules may include a combination of the first microwave introduction module and one of the second to seventh microwave introduction modules.

In addition, in the S-parameter acquisition method of the present disclosure, when the microwave introduction device includes the first to seventh microwave introduction modules, the combination of two selected from the plurality of microwave introduction modules may include at least one of first to third combinations. Here, the first combination is a combination of two microwave introduction modules adjacent to each other along the outer periphery of the virtual regular hexagon. The second combination is a combination of two microwave introduction modules every other microwave introduction module along the outer periphery of the virtual regular hexagon. The third combination is a combination of two microwave introduction modules every two microwave introduction modules along the outer periphery of the virtual regular hexagon.

In addition, in the S-parameter acquisition method of the present disclosure, when the microwave introduction device includes the first to seventh microwave introduction modules, the combination of two selected from the plurality of microwave introduction modules may cover all combinations of the first to seventh microwave introduction modules.

According to another embodiment of the present disclosure, there is provided a method for detecting a malfunction in microwave introduction modules in a plasma processing apparatus including a processing container in which a workpiece is accommodated, a microwave introduction device including a plurality of microwave introduction modules configured to introduce a microwave into the processing container for generating plasma in the processing container, and an exhauster configured to evacuate an interior of the processing container in a pressure reducing manner. The plurality of microwave introduction modules is configured to introduce the microwave into different locations in the processing container.

The malfunction detection method of the present disclosure includes obtaining a difference between absolute values of a plurality of S-parameters acquired according to the S-parameter acquisition method of the present disclosure, and detecting the malfunction is detected based on the difference. In this case, an absolute value of the difference may be compared with a predetermined threshold indicating a malfunction in the plurality of microwave introduction modules. In addition, the difference may be a plurality of differences obtained through mutual calculation for all of the plurality of acquired S-parameters, and the maximum value of the absolute value of the plurality of differences may be compared with the threshold.

In the S-parameter acquisition method of the present disclosure, the microwave is introduced for each of the plurality of microwave introduction modules and the S-parameters are obtained based on the introduced microwave and the reflected microwave. Thus, according to the present disclosure, the S-parameters can be acquired in the plasma processing apparatus provided with the plurality of microwave introduction modules.

In addition, in the malfunction detection method of the present disclosure, the difference between the absolute value of the S-parameter and the absolute value of the S-parameter of different combinations of the plurality of microwave introduction modules is obtained and is compared with a predetermined threshold indicating a malfunction in the plurality of microwave introduction modules. Thus, according to the present disclosure, the malfunction in the microwave introduction modules can be detected.

BRIEF DESCRIPTION OF THE DRAWINGS

FIG. 12 is a flow chart illustrating one example of a procedure of a S-parameter acquisition method according to one embodiment of the present disclosure.

DETAILED DESCRIPTION

Plasma Processing Apparatus

Figure 1:
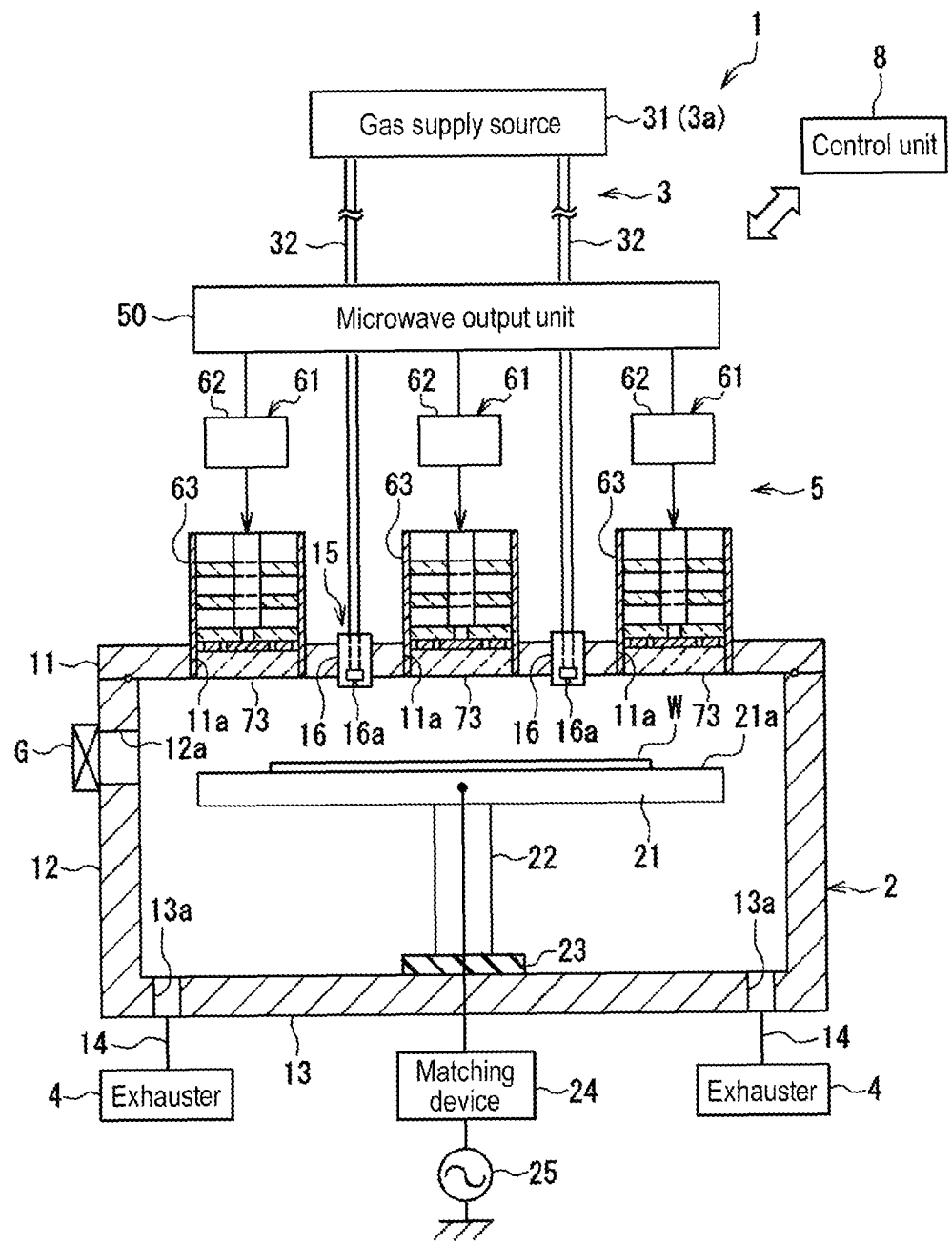
FIG. 1 is a sectional view illustrating a schematic configuration of a plasma processing apparatus according to one embodiment of the present disclosure.
Figure 2:
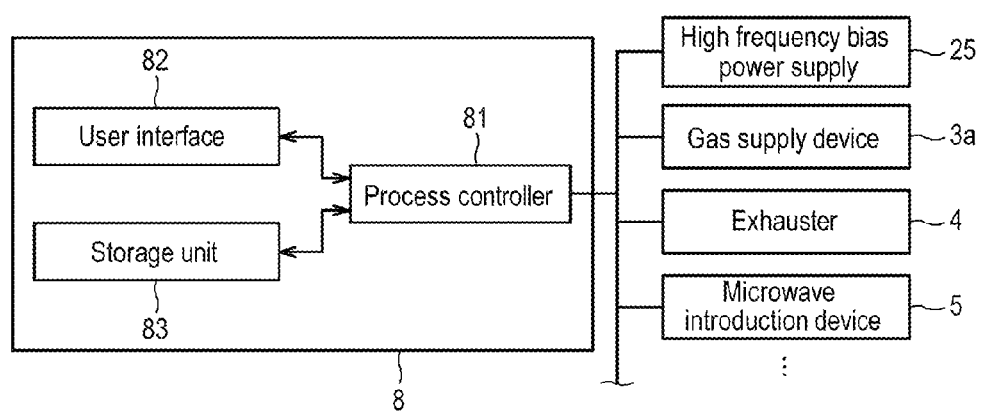
FIG. 2 is an explanatory diagram illustrating a configuration of a control unit shown in FIG. 1.

Embodiments of the present disclosure will now be described in detail with reference to the accompanying drawings. First, the schematic configuration of a plasma processing apparatus to which an S-parameter acquisition method and a malfunction detection method according to one embodiment of the present disclosure are applied will be described with reference to FIGS. 1 and 2. FIG. 1 is a sectional view illustrating the schematic configuration of the plasma processing apparatus according to this embodiment. FIG. 2 is an explanatory diagram illustrating the configuration of a control unit shown in FIG. 1. A plasma processing apparatus 1 of this embodiment is an apparatus for performing predetermined processes such as deposition, diffusion, etching, ashing and the like on a semiconductor wafer W for semiconductor device manufacture (hereinafter simply referred to as a "wafer") through a plurality of successive operations.

The plasma processing apparatus 1 includes a processing container 2 accommodating a wafer W, which is a workpiece, a mounting table 21 disposed inside the processing container 2 and having a mounting surface 21a on which the wafer W is mounted, a gas supply mechanism 3 configured to supply a gas into the processing container 2, an exhauster 4 configured to evacuate the interior of the processing container 2 in a pressure reducing manner, a microwave introduction device 5 including a plurality of microwave introduction modules 61 configured to introduce a microwave into the processing container 2 to generate plasma in the processing container 2, and a control unit 8 configured to control these components of the plasma processing apparatus 1. In addition, instead of the gas supply mechanism 3, an external gas supply mechanism not included in the plasma processing apparatus 1 may be used to supply a gas into the processing container 2.

<Processing Container>

The processing container 2 has a cylindrical shape. The processing container 2 is made of metal material such as aluminum, its alloy or the like. The microwave introduction device 5 is installed at an upper portion of the processing container 2 and acts as a plasma generating means to generate plasma by introducing an electromagnetic wave (microwave) into the processing container 2. The configuration of the microwave introduction device 5 will be described in detail later.

The processing container 2 includes a plate-like ceiling portion 11, a plate-like bottom portion 13, and a side wall portion 12 connecting the ceiling portion 11 and the bottom portion 13. The ceiling portion 11 has a plurality of microwave introduction ports 11a provided to penetrate from an upper surface to a lower surface thereof. The arrangement of the plurality of microwave introduction ports 11a will be described in detail later. The side wall portion 12 has a carry-in/carry-out port 12a to carry in/carry out the wafer W between the processing container 2 and a transfer chamber (not shown) adjacent to the processing container 2. A gate valve G is disposed between the processing container 2 and the transfer chamber (not shown). The gate valve G functions to open/close the carry-in/carry-out port 12a. The gate valve G allows the processing container 2 to be air-tightly sealed in a closed state and allows the wafer W to be transferred between the processing container 2 and the transfer chamber (not shown) in an opened state.

<Exhauster>

The bottom portion 13 has a plurality of (two in FIG. 1) exhaust ports 13a. The plasma processing apparatus 1 also includes an exhaust pipe 14 connecting the exhaust ports 13a and the exhauster 4. The exhauster 4 has an APC valve and a high speed vacuum pump capable of reducing an internal pressure of the processing container 2 to a specified degree of vacuum at a high speed. There is, for example, a turbo molecular pump or the like as the high speed vacuum pump. When the high speed vacuum pump of the exhauster 4 is actuated, the internal pressure of the processing container 2 is reduced down to the specified degree of vacuum, for example, 0.133 Pa.

<Mounting Table>

The plasma processing apparatus 1 includes a support member 22 to support the mounting table 21 in the processing container 2, and an insulating member 23 which is made of insulating material and is interposed between the support member 22 and the bottom portion 13 of the processing container 2. The mounting table 21 is provided to mount the wafer W as the workpiece horizontally. The support member 22 has a cylindrical shape extending from a center of the bottom portion 13 toward an internal space of the processing container 2. The mounting table 21 and the support member 22 are made of aluminum having an alumite-processed (anodic oxidation-processed) surface.

The mounting table 21 has a plurality of support pins (not shown) that are projectable and retractable with respect to the mounting surface 21a. The plurality of support pins is configured to be able to be displaced vertically by an elevating mechanism and to transfer the wafer W between the transfer chamber W and the processing container 2 in a raised position.

<High Frequency Bias Power Supply>

The plasma processing apparatus further includes a high frequency bias power supply 25 for supplying high frequency power to the mounting table 21, and a matching device 24 provided between the mounting table 21 and the high frequency bias power supply 25. The high frequency bias power supply 25 supplies high frequency power to the mounting table 21 in order to attract the wafer W.

<Temperature Control Mechanism>

Although not shown, the plasma processing apparatus 1 further includes a temperature control mechanism configured to heat or cool the mounting table 21. The temperature control mechanism controls the temperature of the wafer W to fall within a range of 25 degrees C. (room temperature) to 900 degrees C.

<Gas Supply Mechanism>

The plasma processing apparatus 1 further includes a gas introduction unit 15 installed in the ceiling portion 11 of the processing container 2. The gas introduction unit 15 has a plurality of nozzles 16 having a cylindrical shape. Each of the nozzles 16 has a gas hole 16a formed in its lower surface.

The gas supply mechanism 3 includes a gas supply device 3a including a gas supply source 31, and a pipe 32 connecting the gas supply source 31 and the gas introduction unit 15. Although one gas supply source 31 is shown in FIG. 1, the gas supply device 3a may include a plurality of gas supply sources, depending on the kind of gas used.

The gas supply source 31 is used as a gas supply source for a rare gas for plasma generation, a processing gas used for oxidation, nitridation, deposition, etching and ashing, and so on. In addition, when a CVD process is performed in the processing container 2, the gas supply source 31 is used as a supply source of a film forming raw material gas, a purge gas used to purge an internal atmosphere of the processing container 2, a cleaning gas used to clean an interior of the processing container 2, and so on.

Although not shown, the gas supply device 3a further includes a mass flow controller and an opening/closing valve which are disposed in the middle of the pipe 32. The kind of gas supplied into the processing container 2, a flow rate of the gas and the like are controlled by the mass flow controller and the opening/closing valve.

<Control Unit>

Although not shown, the respective components of the plasma processing apparatus 1 are connected to the control unit 8 and controlled by the control unit 8. The control unit 8 is typically a computer. As shown in the example shown in FIG. 2, the control unit 8 includes a process controller 81 including a CPU, a user interface 82 and a storage unit 83 which are connected to the process controller 81.

The process controller 81 is a control means for collectively controlling the respective components associated with process conditions such as, for example, temperature, pressure, gas flow rate, high frequency power for applying bias, microwave power and so on in the plasma processing apparatus 1 (for example, the high frequency bias power supply 25, the gas supply device 3a, the exhauster 4, the microwave introduction device 5 and so on).

The user interface 82 includes a keyboard and a touch panel to allow a process manager to input commands for management of the plasma processing apparatus 1, a display for visualizing and displaying operation statuses of the plasma processing apparatus 1, and so on.

The storage unit 83 stores control programs (software) to implement various processes performed in the plasma processing apparatus 1 under control of the process controller 81, recipes in which process condition data and the like are recorded, and so on. The process controller 81 reads and executes any control programs and recipes from the storage unit 83, as necessary, according to instructions such as an instruction from the user interface 82. Thus, under the control of the process controller 81, it is possible to perform a process desired in the processing container 2 of the plasma processing apparatus 1, or perform a process associated with acquisition of S-parameters or malfunction detection, which will be described later.

The control programs and recipes may be utilized by those stored in a computer-readable storage medium such as, for example, a CD-ROM, hard disk, flexible disk, flash memory, DVD, Blu-ray disc or the like. In addition, the recipes may be frequently received online through a dedicated line.

[Microwave Introduction Device]

Figure 3:
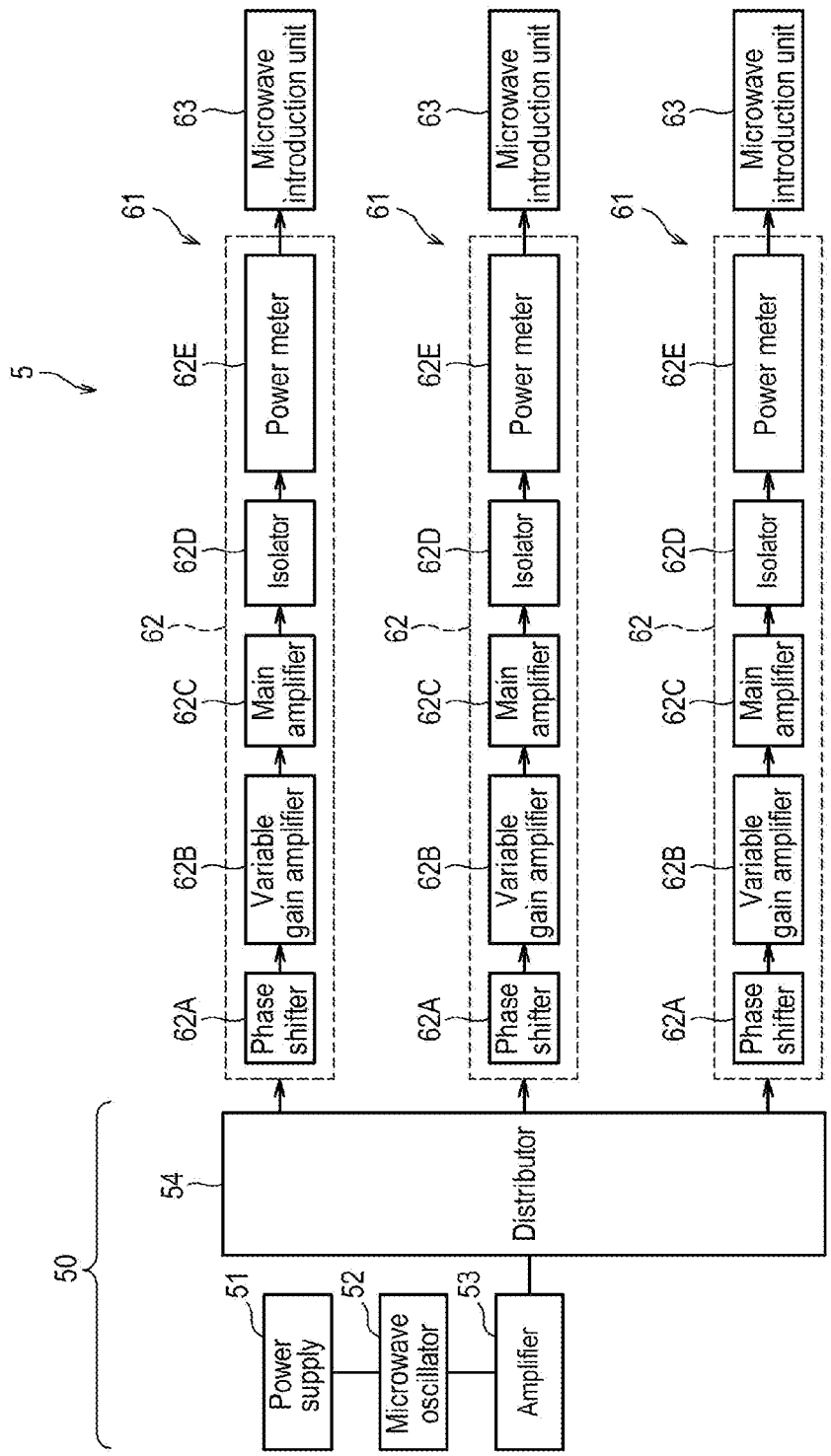
FIG. 3 is an explanatory diagram illustrating a configuration of a microwave introduction device according to one embodiment of the present disclosure.
Figure 4:
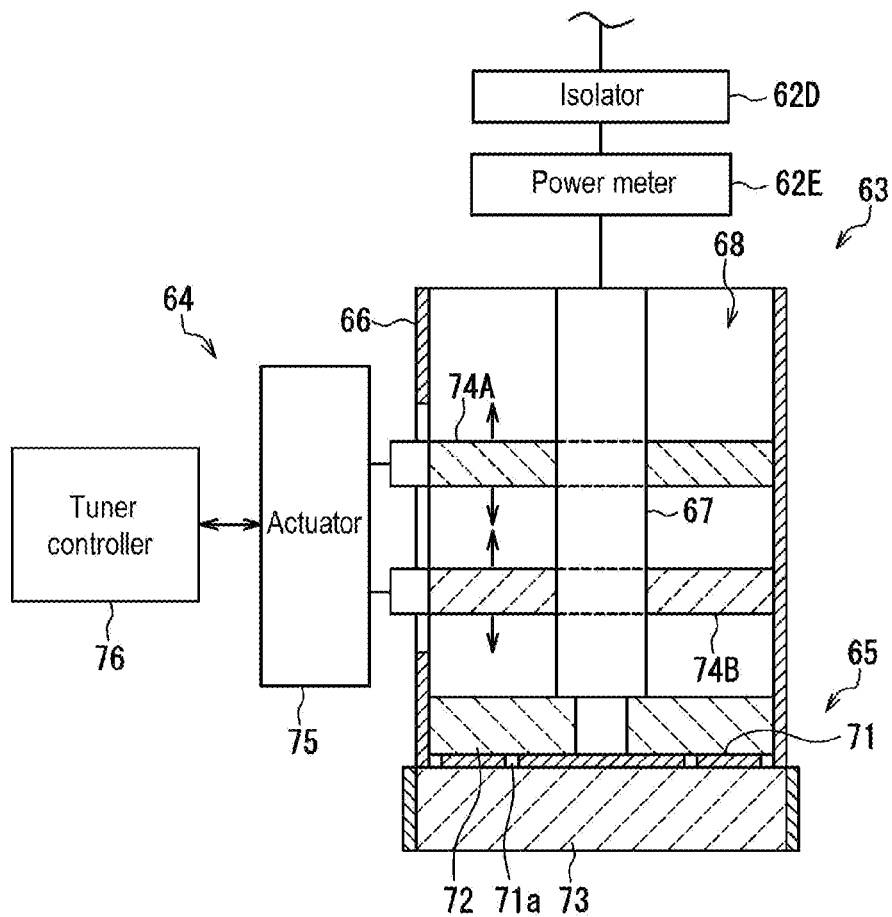
FIG. 4 is a sectional view illustrating a portion of a microwave introduction module according to one embodiment of the present disclosure.
Figure 5:
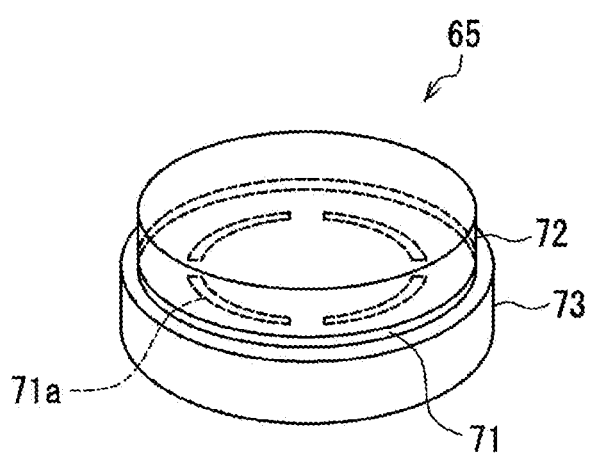
FIG. 5 is a perspective view illustrating an antenna unit of the microwave introduction module according to one embodiment of the present disclosure.
Figure 6:
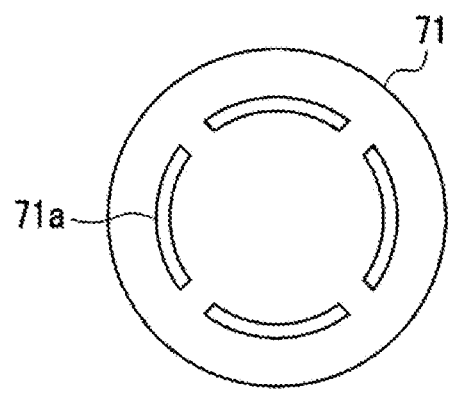
FIG. 6 is a plan view illustrating a planar antenna of the microwave introduction module according to one embodiment of the present disclosure.

Next, the configuration of the microwave introduction device 5 will be described in detail with reference to FIGS. 1 and 3 to 6. FIG. 3 is an explanatory diagram illustrating the configuration of the microwave introduction device 5. FIG. 4 is a sectional view illustrating a portion of a microwave introduction module 61. FIG. 5 is a perspective view illustrating an antenna unit of the microwave introduction module 61. FIG. 6 is a plan view illustrating a planar antenna of the microwave introduction module 61. As illustrated in FIGS. 1 and 3, the microwave introduction device 5 includes a microwave output unit 50 for generating a microwave and distributing and outputting the microwave to a plurality of paths, and a plurality of microwave introduction modules 61 for introducing the microwave distributed by the microwave output unit 50 into different locations in the processing container 2.

<Microwave Output Unit>

The microwave output unit 50 includes a power supply 51, a microwave oscillator 52, an amplifier 53 for amplifying a microwave oscillated by the microwave oscillator 52, and a distributor 64 for distributing the microwave amplified by the amplifier 53 to a plurality of paths. The microwave oscillator 52 oscillates (for example, PLL-oscillates) the microwave at a predetermined frequency (for example, 2.45 GHz). The frequency of the microwave is not limited to 2.45 GHz but may be 8.3 GHz, 5.8 GHz, 1.98 GHz or the like. Further, it may be possible to apply the microwave output unit 50 even when the frequency of the microwave is in a range of 800 MHz to 1 GHz. The distributor 54 distributes the microwave while matching impedance of an input side and an output side.

<Microwave Introduction Module>

The plurality of microwave introduction modules 61 is disposed at different positions and introduces the microwave distributed by the distributor 54 into different locations in the processing container 2. In this embodiment, the plurality of microwave introduction modules 61 has the same configuration. Each microwave introduction module 61 includes an amplifier unit 62 for mainly amplifying the distributed microwaves, and a microwave introduction unit 63 for introducing the microwave output from the amplifier unit 62 into the processing container 2.

(Amplifier Unit)

The amplifier unit 62 includes a phase shifter 62A for shifting a phase of the microwave, a variable gain amplifier 62B for adjusting a power level of the microwave to be input to a main amplifier 62C, the main amplifier 62C configured as a solid state amplifier, an isolator 62D for isolating a microwave reflected by the antenna unit of the microwave introduction unit 63, which will be described later, toward the main amplifier 62C, and a power meter 62E for measuring power of the microwave introduced into the processing container 2 and power of the reflected microwave reflected in the processing container 2.

The phase shifter 62A is configured to shift the phase of the microwave to change the radiation characteristics of the microwave. The phase shifter 62A is used to adjust the phase of the microwave for each microwave introduction module 61 to control the direction in which the microwave is radiated, thereby changing distribution of plasma. If this adjustment of the radiation characteristics is not performed, the phase shifter 62A may not be provided.

The variable gain amplifier 62B is used to adjust variations of individual microwave introduction modules 61 or plasma intensity. For example, by varying the variable gain amplifier 62B for each microwave introduction module 61, the entire plasma distribution in the processing container 2 can be adjusted.

Although not shown, the main amplifier 62C includes, for example, an input matching circuit, a semiconductor amplifying element, an output matching circuit and a high Q resonance circuit. Examples of the semiconductor amplifying element may include GaAsHEMT, GaNHEMT and LD (Laterally Diffused)-MOS which can perform a class-E operation.

The isolator 62D includes a circulator and a dummy load (coaxial terminator). The circulator guides the microwave reflected by the antenna unit of the microwave introduction unit 63, which will be described later, to the dummy load. The dummy load converts the microwave guided by the circulator into heat. As described above, in this embodiment, the plurality of microwave introduction modules 61 is provided and the microwaves introduced into the processing container 2 by the respective microwave introduction units 63 of the plurality of microwave introduction modules 61 are synthesized in the processing container 2. For this reason, each isolator 62D may be small in size and may be installed in proximity to the main amplifier 62C.

The power meter 62E is configured to be able to measure the power of the microwave introduced into the processing container 2 and the reflected microwave. For example, the power meter 62E may be constituted by a directional coupler capable of detecting an incident wave and a reflected wave. A position of the power meter 62E is not limited to the example shown in FIG. 3 but may be set arbitrarily. The amplifier unit 62 may include a power meter for measuring power of the microwave introduced into the processing container 2 and a power meter for measuring power of the reflected microwave, instead of the power meter 62E. In this case, these power meters may be disposed at different positions. For example, the power meter for measuring power of the microwave introduced into the processing container 2 may be disposed at a position closer to the microwave oscillator 52.

(Microwave Introduction Unit)

As shown in FIG. 1, the plurality of microwave introduction units 63 is installed in the ceiling portion 11. As shown in FIG. 4, each microwave introduction unit 63 includes a tuner 64 for matching impedance, an antenna unit 65 for radiating an amplified microwave into the processing container 2, a body container 66 and an inner conductor 67. The body container 66 and inner conductor 67 are made of metal material and form a coaxial tube. The body container 66 has a cylindrical shape extending vertically in FIG. 4 and forms an outer conductor of the coaxial tube. The inner conductor 67 has a bar-like or cylindrical shape extending vertically in FIG. 4. A space between an inner peripheral surface of the body container 66 and an outer peripheral surface of the inner conductor 67 forms a microwave transmission line 68.

Although not shown, the microwave introduction module 61 further includes a power feed converting unit installed in a base end side (upper side) of the body container 66. The power feed converting unit is connected to the amplifier unit 62 via a coaxial cable.

The antenna unit 65 is provided on an opposite side to the power feed converting unit in the body container 66. As will be described later, a portion of the base end side is in an impedance adjustable range by the tuner 64 beyond the antenna unit 65 in the body container 66.

As shown in FIGS. 4 and 5, the antenna unit 65 includes a planar antenna 71 connected to a lower end of the inner conductor 67, a microwave-delaying member 72 disposed in an upper surface side of the planar antenna 71, and a microwave transmission plate 73 disposed in a lower surface side of the planar antenna 71. A lower surface of the microwave transmission plate 73 is exposed to the internal space of the processing container 2. The microwave transmission plate 73 is fitted to the plurality of microwave introduction ports 11a of the ceiling portion 11 through the body container 66.

The planar antenna 71 has a disc shape. The planar antenna 71 has slots 71a formed to penetrate through the planar antenna 71. In the example shown in FIGS. 5 and 6, four slots 71a are formed, and each of the four slots 71a has an arc shape equally separated from each other. The number of slots 71a is not limited to four but may be five or more or may be one to three. The shape of the slots 71a is not limited to an arc shape but may have, for example, a rectangular shape.

The microwave-delaying member 72 is made of material having a larger dielectric constant than that of a vacuum. Examples of the material of the microwave-delaying member 72 may include quartz, ceramics, fluorine-based resin such as polytetrafluoroethylene resin, polyimide resin and so on. A wavelength of the microwave lengthens in a vacuum. The microwave-delaying member 72 has a function to adjust plasma by shortening the wavelength of the microwave. The phase of the microwave is varied depending on the thickness of the microwave-delaying member 72. Accordingly, it is possible to suppress the reflected microwave in the planar antenna 71 and increase a radiation energy of the microwave radiated from the planar antenna 71. As a result, the power of the microwave can be efficiently introduced into the processing container 2.

The microwave transmission plate 73 is made of dielectric material. Examples of the dielectric material, which is used to form the microwave transmission plate 73, may include quartz, ceramics and so on. The microwave transmission plate 73 has a shape to allow the microwave to be efficiently radiated in a TE mode. In an example shown in FIG. 5, the microwave transmission plate 73 has a cylindrical shape. The microwave transmission plate 73 is not limited to a cylindrical shape but may have a rectangular shape, a pentagonal pillar shape, a hexagonal pillar shape or an octagonal pillar shape.

In the microwave introduction unit 63 configured as above, the microwave amplified by the main amplifier 62C reaches the planar antenna 71 through the space between the inner peripheral surface of the body container 66 and the outer peripheral surface of the inner conductor 67 (the microwave transmission line 68 and is radiated from the slots 71a of the planar antenna 71 into the internal space of the processing container 2 through the microwave transmission plate 73.

The tuner 64 constitutes a slug tuner. Specifically, as shown in FIG. 4, the tuner 64 includes two slugs 74A and 74B disposed at a portion of the base end side (upper side) beyond the antenna unit 65 of the body container 66, an actuator 75 for actuating the two slugs 74A and 74B, and a tuner controller 76 for controlling the actuator 75.

The slugs 74A and 74B are plates having an annular shape and are interposed between the inner peripheral surface of the body container 66 and the outer peripheral surface of the inner conductor 67. The slugs 74A and 74B are made of dielectric material. An example of the dielectric material of the slugs 74A and 74B may include high purity alumina whose relative dielectric constant is 10. Since the high purity alumina has a higher relative dielectric constant than those of quartz (relative dielectric constant of 3.88) and Teflon®

(relative dielectric constant of 2.03) which are materials typically used to form slugs, it is possible to reduce the thickness of the slugs 74A and 74B. In addition, the high purity alumina has a smaller dielectric loss tangent (tan δ) compared with the quartz and Teflon®, so that it has a property to be able to reduce loss of the microwave. In addition, the high purity alumina has properties of small distortion and high heat resistance. As the high purity alumina, an alumina sintered body having purity of 99% or more is preferred in some embodiments. Further, single crystal alumina (sapphire) may be used as the high purity alumina.

The tuner 64 moves the slugs 71A and 74B vertically by means of the actuator 75 based on a command from the tuner controller 76. Thus, the tuner 64 adjusts impedance. For example, the tuner controller 76 adjusts positions of the slugs 74A and 74B such that the impedance of a terminal portion becomes 50Ω.

The main amplifier 62C, the tuner 64 and the planar antenna 71 are located adjacent to each other. In particular, the tuner 64 and the planar antenna 71 constitute a lumped constant circuit and act as a resonator. Impedance mismatching exists in a portion where the planar antenna 71 is installed. In this embodiment, since plasma can be tuned with high precision by the tuner 64, an effect of reflection in the planar antenna 71 can be eliminated. In addition, since impedance mismatching up to the planar antenna 71 can be eliminated with high precision by the tuner 64, a mismatching portion may be substantially a plasma space. Thus, plasma can be controlled with high precision by the tuner 64.

[Microwave Introduction Port]

Figure 7:
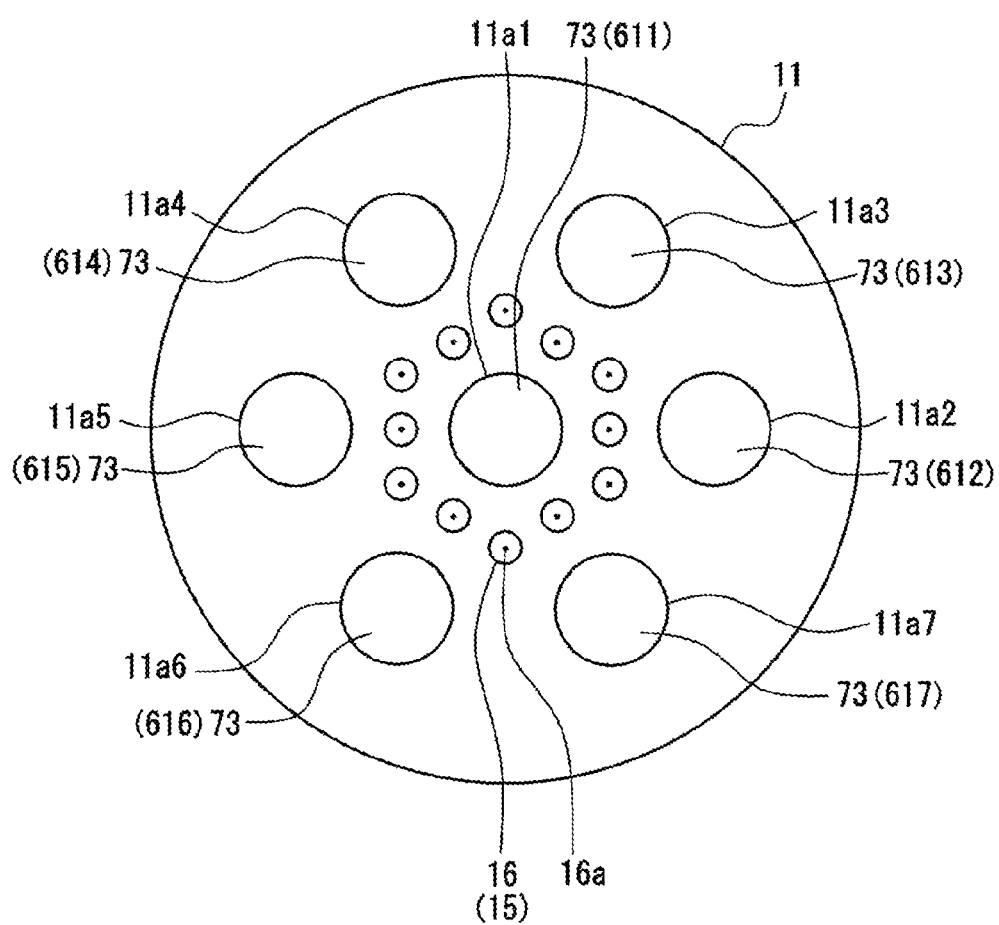
FIG. 7 is a plan view showing the bottom of a ceiling portion of a processing container according to one embodiment of the present disclosure.

Next, the arrangement of the plurality of microwave introduction ports 11a in the ceiling portion 11 will be described with reference to FIG. 7. FIG. 7 is a plan view showing a bottom surface of the ceiling portion 11 of the processing container 2. The body container 66 is not shown in FIG. 7.

In this embodiment, the microwave introduction device 5 includes first to seventh microwave introduction modules 611, 612, 613, 614, 615, 616 and 617 as the plurality of microwave introduction modules 61. The ceiling portion 11 includes first to seventh microwave introduction ports 11a1, 11a2, 11a3, 11a4, 11a5, 11a6 and 11a7 as the plurality of microwave introduction ports 11a. The first to seventh microwave introduction ports 11a1 to 11a7 pass the microwave introduced from the first to seventh microwave introduction modules 611 to 617 into the interior of the processing container 2, respectively.

The first microwave introduction port 11a1 is disposed in a central portion of the ceiling portion 11. The second to seventh microwave introduction ports 11a2 to 11a7 are respectively disposed at vertices of a virtual regular hexagon centered on the first microwave introduction port 11a1 in the ceiling portion 11. The first microwave introduction port 11a1 is disposed such that a center in its planar shape (shape viewed from above) coincides or substantially coincides with a center of the virtual regular hexagon. The second to seventh microwave introduction ports 11a2 to 11a7 are disposed such that the centers in their respective planar shapes coincide or substantially coincide with the vertices of the virtual regular hexagon, respectively. The substantial coincidence of the center(s) of the planar shape(s) with the center or vertices of the virtual regular hexagon means that the position of the center(s) of the planar shape(s) may be slightly deviated from a desired position from a viewpoint of machining accuracy of the first to seventh microwave introduction ports 11a1 to 11a7.

The microwave transmission plates 73 of the first to seventh microwave introduction modules 611 to 617 are respectively fitted to the first to seventh microwave introduction ports 11a1 to 11a7. As shown in FIG. 4, the microwave introduction unit 63, which is a part of the first to seventh microwave introduction ports 11a1 to 11a7, forms an integral structure including the microwave transmission plate 73. Therefore, the first to seventh microwave introduction modules 611 to 617 are disposed at different positions depending on the arrangement of first to seventh microwave introduction ports 11a1 to 11a7 shown in FIG. 7, respectively. The first microwave introduction module 611 is disposed in the center of the ceiling portion 11 when viewed from above. The second to seventh microwave introduction modules 612 to 617 are respectively disposed at the vertices of the virtual regular hexagon centered on the first microwave introduction module 611 in the ceiling portion 11 when viewed from above.

The plurality of nozzles 16 of the gas introduction unit 15 is disposed to surround the first microwave introduction port 11a1 between the first microwave introduction port 11a1 and the second to seventh microwave introduction ports 11a2 to 11a7.

[Processing Procedure]

Next, one example of plasma processing in the plasma processing apparatus 1 will be described. Here, a plasma processing procedure will be illustrated by referring to an example of performing a nitridation process on a surface of a wafer W using a nitrogen-containing gas as a processing gas. First, a command to cause the plasma processing apparatus 1 to perform a plasma nitridation process is input from the user interface 82 to the process controller 81. Next, the process controller 81 reads recipes stored in the storage unit 83 or a computer-readable storage medium in response to the command. Next, a control signal to cause the plasma nitridation process to be performed according to conditions based on the recipes is sent from the process controller 81 to each end device (for example, the high frequency bias power supply 25, the gas supply device 3a, the exhauster 4, the microwave introduction device 5 and so on) of the plasma processing apparatus 1.

Next, the gate valve G is opened and then the wafer W is carried into the processing container 2 via the gate valve G and the carry-in/carry-out port 12a by means of a transfer device (not shown). The wafer W is mounted on the mounting surface 21a of the mounting table 21. Next, the gate valve G is closed and the interior of the processing container 2 is depressurized and evacuated by the exhauster 4. Next, specified flow rates of a rare gas and a nitrogen-containing gas are introduced into the processing container 2 through the gas introduction unit 15 by means of the gas supply mechanism 3. The internal pressure of the processing container 2 is adjusted to a predetermined pressure by adjusting exhaust volume and an amount of gas supply.

Next, a microwave, which will be introduced into the processing container 2, is generated in the microwave output unit 50. The microwave output from the distributor 54 of the microwave output unit 50 is input to the plurality of microwave introduction modules 61 and is introduced into the processing container 2 by means of each microwave introduction module 61. In each microwave introduction module 61, the microwave propagates through the amplifier unit 62 and the microwave introduction unit 63. The microwave, which reaches the antenna unit 65 of the microwave introduction unit 63, transmits through the microwave transmission plate 73 from the slots 71a of the planar antenna 71 and then is radiated into a space above the wafer W in the processing container 2. In this manner, the microwaves are introduced into the processing container 2 by means of the microwave introduction modules 61.

The microwaves introduced into the processing container 2 create plasma with an inert gas and a processing gas such as a nitrogen-containing gas or the like, which are introduced into the processing container 2, and are synthesized in the processing container 2. Then, a silicon surface of the wafer W is nitrided by action of active species in the plasma, such as radicals and ions, to thereby form a silicon nitride film (SiN).

When a control signal to end the plasma processing is sent from the process controller 81 to each end device of the plasma processing apparatus 1, the generation of the microwave is stopped and the supply of the rare gas and the nitrogen-containing gas is stopped, so that the plasma processing is ended. Next, the gate valve G is opened and the wafer W is carried out by means of the transfer device (not shown).

When an oxygen-containing gas is used instead of the nitrogen-containing gas, the wafer W can be subjected to an oxidation process. In addition, a film forming raw material gas can be used to subject the wafer W to a film forming process by means of a plasma CVD method.

[S-Parameter Acquisition Method]

Next, an S-parameter acquisition method according to this embodiment will be described. Here, a case where the microwave introduction device 5 includes the above-described first to seventh microwave introduction modules 611 to 617 will be illustrated.

A relationship between a microwave introduced from the first to seventh microwave introduction modules 611 to 617 into the processing container 2 (hereinafter referred to as an incident microwave) and a reflected microwave reflected from the processing container 2 into the first to seventh microwave introduction modules 611 to 617 is expressed by the following equation (1).

[Eq. 1]

$$\begin{pmatrix} b_1 \\ b_2 \\ b_3 \\ b_4 \\ b_5 \\ b_6 \\ b_7 \end{pmatrix} = \begin{pmatrix} S_{11} & S_{12} & S_{13} & S_{14} & S_{15} & S_{16} & S_{17} \\ S_{21} & S_{22} & S_{23} & S_{24} & S_{25} & S_{26} & S_{27} \\ S_{31} & S_{32} & S_{33} & S_{34} & S_{35} & S_{36} & S_{37} \\ S_{41} & S_{42} & S_{43} & S_{44} & S_{45} & S_{46} & S_{47} \\ S_{51} & S_{52} & S_{53} & S_{54} & S_{55} & S_{56} & S_{57} \\ S_{61} & S_{62} & S_{63} & S_{64} & S_{65} & S_{66} & S_{67} \\ S_{71} & S_{72} & S_{73} & S_{74} & S_{75} & S_{76} & S_{77} \end{pmatrix} \begin{pmatrix} a_1 \\ a_2 \\ a_3 \\ a_4 \\ a_5 \\ a_6 \\ a_7 \end{pmatrix} \quad (1)$$

In Equation (1), $a_1$ to $a_7$ denote incident microwaves introduced by the first to seventh microwave introduction modules 611 to 617, respectively, and $b_1$ to $b_7$ denote the reflected microwaves reflected in the first to seventh microwave introduction modules 611 to 617, respectively. Here, i and j represent an integer of 1 to 7, respectively. In the following description, among the first to seventh microwave introduction modules 611 to 617, any microwave introduction modules are referred to as an "i-th microwave introduction module 61i" and a "j-th microwave introduction module 61j" using i and j. $S_{ij}$ denotes S-parameters representing the relationship between the incident microwave introduced by the j-th microwave introduction module 61j and the reflected microwave reflected into the i-th microwave introduction module 61i. Under a condition where the interior of the processing container 2 is in the vacuum state and no plasma is generated, ideally, S-parameters satisfy the relationship expressed by the following equation (2).

[Eq. 2]

$$\begin{cases} S_{ij} = S_{ji} \\ S_{i1} = S_{1j} \ (i \neq j) \\ S_{ii} = S_{jj} \ (i \neq 1, j \neq 1) \\ S_{i,i+1} = S_{j,j+1} = S_{j,j+5} \ (i \neq j \neq 1) \\ S_{i,i+2} = S_{j,j+2} = S_{j,j+4} \ (i \neq j \neq 1) \\ S_{i,j+3} = S_{j,j+3} \ (i \neq j \neq 1) \end{cases} \quad (2)$$

In Equation (2), the equation $S_{ij}=S_{ji}$ indicates that a S-parameter $S_{ij}$ representing a relationship between an incident microwave introduced by a j-th microwave introduction module 61j and a reflected microwave that is reflected into the i-th microwave introduction module 61i is equal to a S-parameter $S_{ji}$ representing a relationship between an incident microwave introduced by the i-th microwave introduction module 61i and a reflected microwave to be reflected into the j-th microwave introduction module 61j. The same is true for other equations in Equation (2).

In order to make the distribution of plasma uniform n the processing container 2, it is preferable in some embodiments that the S-parameters satisfy the relationship expressed by Equation (2). However, among the plurality of microwave introduction modules 61, if a malfunction occurs in one or more microwave introduction modules 61, a balance between the microwave introduction modules 61 is broken to make it impossible to satisfy the relationship expressed by Equation (2). Accordingly, by using the S-parameters (for example, by examining the relationship between the S-parameters), it is possible to detect a malfunction in the plurality of microwave introduction modules 61.

Hereinafter, an S-parameter acquisition method will be described in detail. In this embodiment, the S-parameters are obtained using power of a reflected microwave and an incident microwave, which is measured by the power meter 62E. In a condition where plasma is generated in the processing container 2, the incident microwave is absorbed in the plasma to make it difficult to accurately measure the power of the reflected microwave. To prevent this, it is preferable in some embodiments to find the S-parameters under the condition where the processing container is in the vacuum state and no plasma is generated. Here, "the condition where no plasma is generated" refers to a condition where no processing gas is supplied into the processing container 2 or a condition where a gas supply amount and a pressure condition are provided to an extent that no plasma discharge is clearly generated according to a Paschen curve.

First, a method of obtaining an S-parameter $S_{i1}$ representing the relationship between the incident microwave introduced from the first microwave introduction module 611 into the processing container 2 and the reflected microwave that is reflected into the i-th microwave introduction module 61i will be described. In obtaining an S-parameter $S_{i1}$, first, the introduction of the microwave into the second to seventh microwave introduction modules 612 to 617 is stopped. In this case, the relationship between the incident microwave and the reflected microwave is expressed by the following equation (3).

[Eq. 3]

$$\begin{pmatrix} b_1 \\ b_2 \\ b_3 \\ b_4 \\ b_5 \\ b_6 \\ b_7 \end{pmatrix} = \begin{pmatrix} S_{11} & S_{12} & S_{13} & S_{14} & S_{15} & S_{16} & S_{17} \\ S_{21} & S_{22} & S_{23} & S_{24} & S_{25} & S_{26} & S_{27} \\ S_{31} & S_{32} & S_{33} & S_{34} & S_{35} & S_{36} & S_{37} \\ S_{41} & S_{42} & S_{43} & S_{44} & S_{45} & S_{46} & S_{47} \\ S_{51} & S_{52} & S_{53} & S_{54} & S_{55} & S_{56} & S_{57} \\ S_{61} & S_{62} & S_{63} & S_{64} & S_{65} & S_{66} & S_{67} \\ S_{71} & S_{72} & S_{73} & S_{74} & S_{75} & S_{76} & S_{77} \end{pmatrix} \begin{pmatrix} a_1 \\ 0 \\ 0 \\ 0 \\ 0 \\ 0 \\ 0 \end{pmatrix} \quad (3)$$

Next, while introducing the incident microwave into the processing container 2 by means of the first microwave introduction module 611, the power of the incident microwave is measured by the power meter 62E of the first microwave introduction module 611. Next, the power of the reflected microwave is measured by the power meter 62E of each of the first to seventh microwave introduction modules 611 to 617. The power of the incident microwave and the power of the reflected microwave satisfy a relationship expressed by the following equation (4).

[Eq. 4]

$$|b_1|^2 = |S_{i1}|^2 \cdot |a_1|^2 \quad (4)$$

In Equation (4), $|a_1|^2$ represents the power of the incident microwave introduced into the processing container 2 by means of the first microwave introduction module 611, $|b_i|^2$ represents the power of the reflected microwave measured in the i-th microwave introduction module 61i, and $|S_{i1}|^2$ represents a square of the absolute value of the S-parameter $S_{i1}$. As can be understood from Equation (4), $|S_{i1}|^2$ can be obtained from $|a_1|^2$ and $|b_i|^2$. In this embodiment, the incident microwave introduced by means of the first microwave introduction module 611 includes a plurality of incident waves having different power. As one example, the incident microwave may include five incident waves, each having different power by 1 W within a range of 1 W to 5 W. The reflected microwave includes a plurality of reflected waves corresponding respectively to the plurality of incident waves. Then, $|S_{i1}|^2$ is obtained from a plurality of $|a_1|^2$ and $|b_i|^2$ using the least-squares method and the S-parameter $S_{i1}$ is obtained based on the obtained $|S_{i1}|^2$.

A method of obtaining an S-parameter $S_{ij}$ (j≠1) representing the relationship between the incident microwave introduced from the second to seventh microwave introduction modules 612 to 617 into the processing container 2 and the reflected microwave reflected into the i-th microwave introduction module 61i is the same as the above-described method of obtaining the S-parameter $S_{i1}$. That is, the S-parameter can be obtained by introducing the incident microwave by each of the second to seventh microwave introduction modules 612 to 617 and measuring the reflected microwave that is reflected into the first to seventh microwave introduction modules 611 to 617.

The S-parameter $S_{ij}$ related to a combination of two selected from the plurality of microwave introduction modules 61 may be obtained so as to cover all combinations of two selected from the plurality of microwave introduction modules 61 or may be obtained for a particular combination. Examples of the particular combination may include a combination of the first microwave introduction module 611 and the second to seventh microwave introduction modules 612 to 617, or a combination between the second to seventh microwave introduction modules 612 to 617. Examples of the combination between the second to seventh microwave introduction modules 612 to 617 may include first to third combinations as described below.

Figure 8:
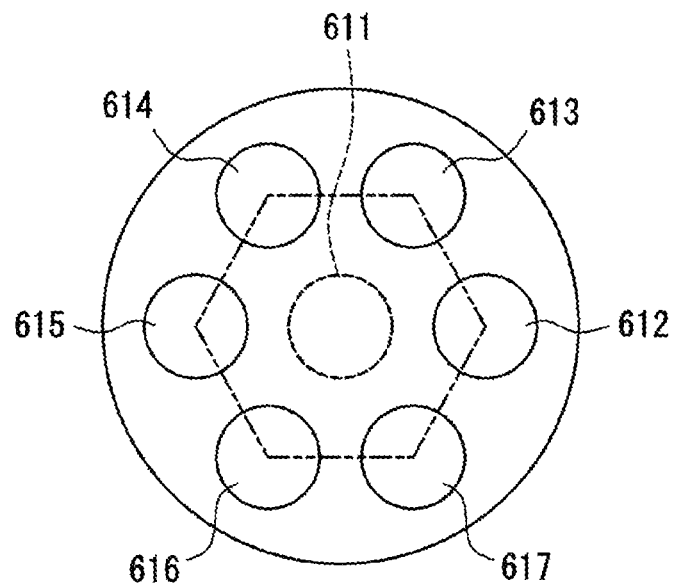
FIG. 8 is an explanatory view illustrating a first combination of a plurality of microwave introduction modules according to one embodiment of the present disclosure.

FIG. 8 is an explanatory view illustrating the first combination. The first combination is a combination of two microwave introduction modules 61 adjacent to each other along the outer periphery of the above-described virtual regular hexagon. In FIG. 8, the combination of two microwave introduction modules 61 adjacent to each other is indicated by a two-dot chain line.

Figure 9:
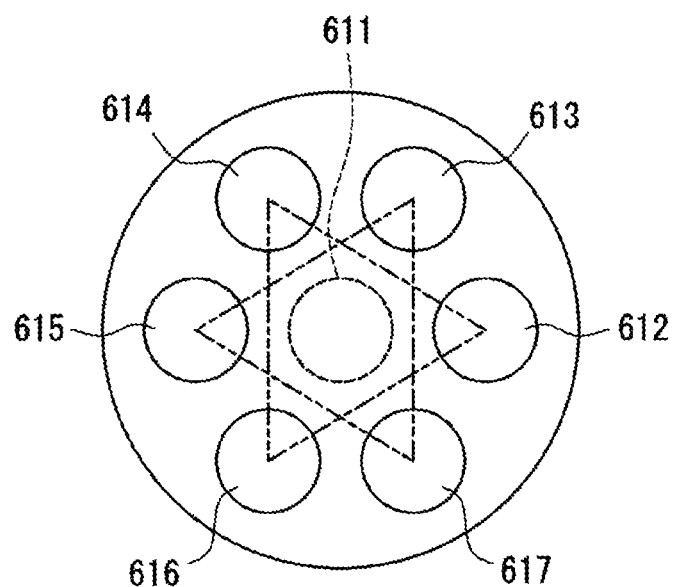
FIG. 9 is an explanatory view illustrating a second combination of a plurality of microwave introduction modules according to one embodiment of the present disclosure.

FIG. 9 is an explanatory view illustrating the second combination. The second combination is a combination of two microwave introduction modules 61 every other microwave introduction module along the outer periphery of the above-described virtual regular hexagon. In FIG. 9, the combination of two microwave introduction modules 61 every other microwave introduction module is indicated by a two-dot chain line.

Figure 10:
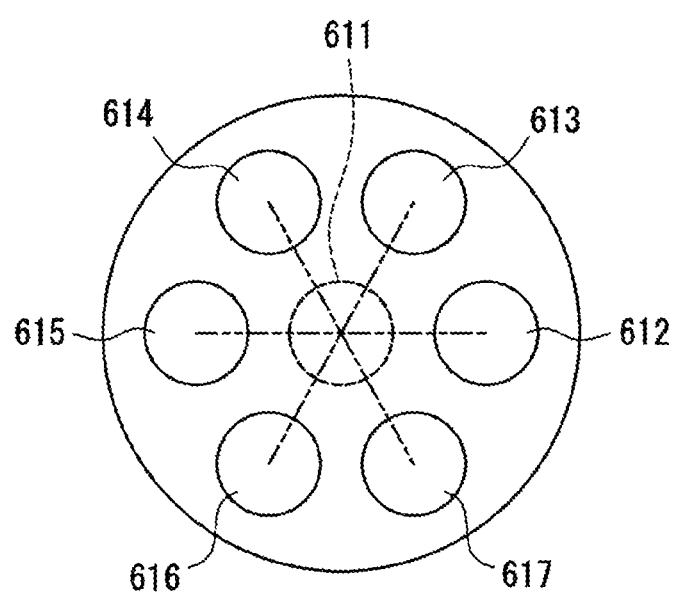
FIG. 10 is an explanatory view illustrating a third combination of a plurality of microwave introduction modules according to one embodiment of the present disclosure.

FIG. 10 is an explanatory view illustrating the third combination. The third combination is a combination of two microwave introduction modules 61 every two microwave introduction modules along the outer periphery of the above-described virtual regular hexagon. In FIG. 10, the combination of two microwave introduction modules 61 every two microwave introduction modules is indicated by a two-dot chain line.

[Malfunction Detection Method]

Next, a malfunction detection method according to this embodiment will be described. In this embodiment, a malfunction in the plurality of microwave introduction modules 61 is detected using the S-parameter $S_{ij}$ acquired as described above. This malfunction detection may be performed at any time after start of operation of the plasma processing apparatus 1. For example, the malfunction detection may be performed before processing a workpiece of a particular lot.

Hereinafter, the malfunction detection method according to this embodiment will be described in detail. In this embodiment, the malfunction in the plurality of microwave introduction modules 61 is detected by obtaining a difference between an absolute value of the S-parameter $S_{ij}$ of an arbitrary combination of two selected from the plurality of microwave introduction modules 61 and an absolute value of the S-parameter $S_{ij}$ of two microwave introduction modules 61 of a different combination and comparing an absolute value of the difference with a predetermined threshold indicating the malfunction in the plurality of microwave introduction modules 61. The absolute value of the difference includes $\Delta S_1$, $\Delta S_2$, $\Delta S_3$, $\Delta S_4$, $\Delta S_5$ and $\Delta S_6$, as defined by the following equation (5).

[Eq. 5]

$$\begin{cases} \Delta S_1 = ||S_{ij}| - |S_{ji}|| \\ \Delta S_2 = ||S_{i1}| - |S_{1j}|| \ (i \neq j) \\ \Delta S_3 = ||S_{ii}| - |S_{jj}|| \ (i \neq 1, j \neq 1) \\ \Delta S_4 = \begin{cases} ||S_{i,i+1}| - |S_{j,j+1}|| \\ ||S_{j,j+1}| - |S_{j,j+5}|| \ (i \neq j \neq 1) \\ ||S_{j,j+5}| - |S_{i,i+1}|| \end{cases} \\ \Delta S_5 = \begin{cases} ||S_{i,i-2}| - |S_{j,j+2}|| \\ ||S_{j,j+2}| - |S_{j,j+4}|| \ (i \neq j \neq 1) \\ ||S_{j,j-4}| - |S_{i,i+2}|| \end{cases} \\ \Delta S_6 = ||S_{i,i+3}| - |S_{j,j+3}|| \ (i \neq j \neq 1) \end{cases} \quad (5)$$

Equation (5) is derived from Equation (2). Therefore, ideally, $\Delta S_1$ to $\Delta S_6$ become zero. However, if any malfunction occurs in the microwave introduction modules 61, $\Delta S_1$ to $\Delta S_6$ become larger than zero. Examples of the malfunction in the microwave introduction modules 61 may include failures in the amplifier unit 62, the tuner 64, the antenna unit 65 and so on.

$\Delta S_4$ represents an absolute value of a difference between S-parameters $S_{ij}$ of the above-described first combination, $\Delta S_5$ represents an absolute value of a difference between S-parameters $S_{ij}$ of the above-described second combination, and $\Delta S_6$ represents an absolute value of a difference between S-parameters $S_{ij}$ of the above-described third combination.

Next, in this embodiment, the maximum values of the respective $\Delta S_1$ to $\Delta S_6$ are obtained. Hereinafter, the maximum values of $\Delta S_1$ to $\Delta S_6$ are referred to as $\Delta S_{1max}$ to $\Delta S_{6max}$, respectively. Next, the largest value $\Delta S_{max}$ is obtained among $\Delta S_{1max}$ to $\Delta S_{6max}$. In this manner, by using the maximum values $\Delta S_{1max}$ to $\Delta S_{6max}$ and the largest value $\Delta S_{max}$, it is possible to reduce a load of calculation process in comparison with a threshold, as will be described later. Next, $\Delta S_{max}$ is compared with a predetermined threshold indicating the malfunction in the plurality of microwave introduction module 61. For example, if $\Delta S_{max}$ is smaller than the predetermined threshold, it is determined that all of the microwave introduction modules 61 are normal. If $\Delta S_{max}$ is equal to or larger than the predetermined threshold, it is determined that at least one of the microwave introduction modules 61 is abnormal. The threshold can be set to a predetermined value, for example, 0.07, by referring to S-parameters indicating the normality of the microwave introduction modules 61 and the malfunction of the microwave introduction modules 61.

A microwave introduction module 61 in which the malfunction occurs can be identified, for example, by checking a combination that $\Delta S_{max}$ is obtained among the combinations of the plurality of microwave introduction modules 61.

Here, a process after the abnormality is detected will be described in brief. First, a microwave introduction module 61 whose malfunction is detected is removed from the plasma processing apparatus 1 and is replaced with a normal microwave introduction module 61. Thus, the plasma processing apparatus 1 can be normally operated. On the other hand, the microwave introduction module 61 removed from the plasma processing apparatus 1 is subjected to various operation checks and undergoes repairs such as part replacement based on results of the checks. Thus, this microwave introduction module 61 can be used as a normal microwave introduction module 61.

Figure 11:
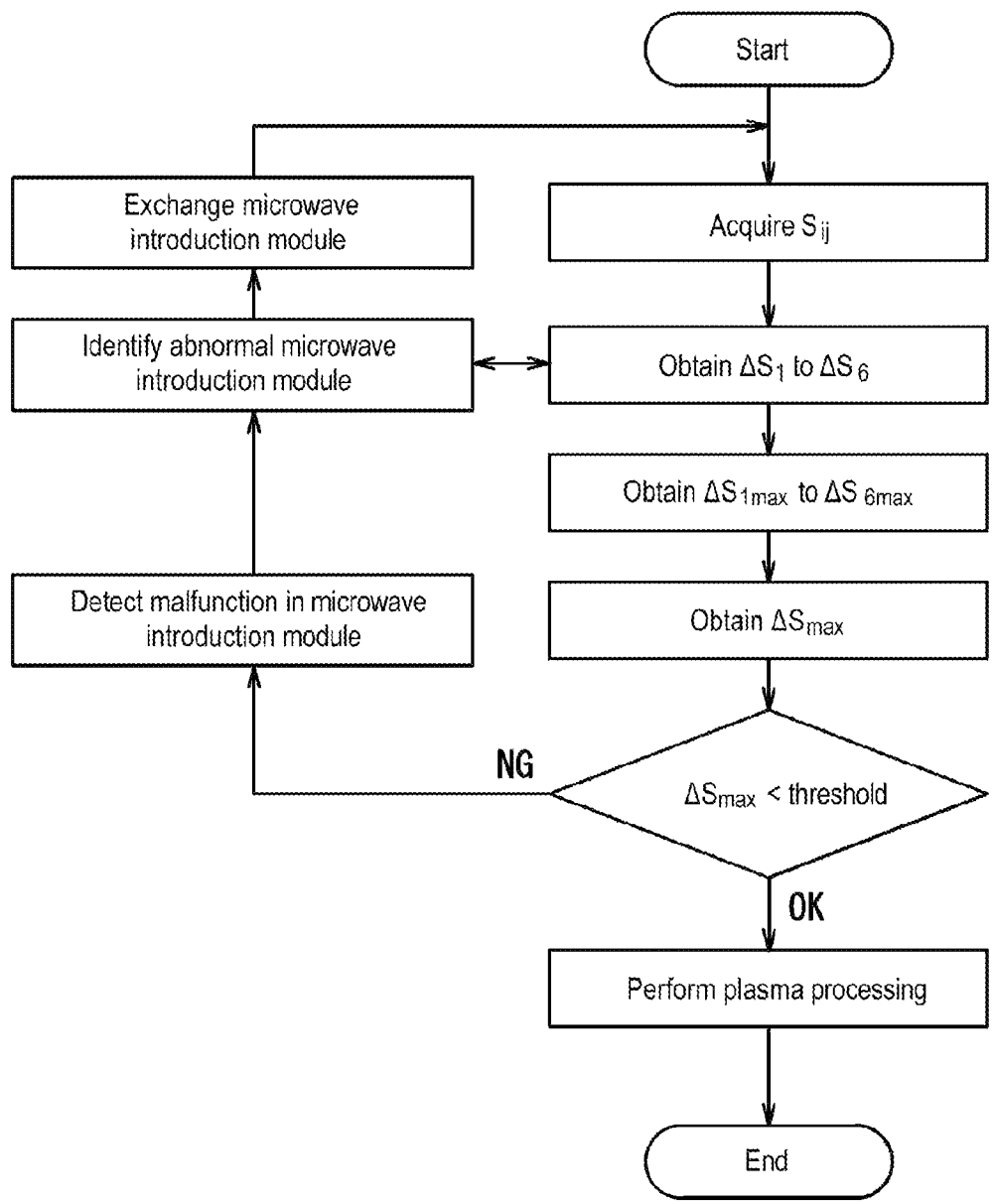
FIG. 11 is a flow chart illustrating one example of a procedure of a malfunction detection method according to one embodiment of the present disclosure.

Next, a case where the malfunction detection method according to this embodiment is carried out before plasma processing in the plasma processing apparatus 1 will be illustrated with reference to FIGS. 11 and 12. FIG. 11 is a flow chart illustrating one example of a procedure of the malfunction detection method. FIG. 12 is a flow chart illustrating one example of a procedure of the S-parameter acquisition method. In this example, an S-parameter $S_{ij}$ is first acquired. At this time, the interior of the processing container 2 is put in a vacuum state and a state that no plasma is generated. As shown in FIG. 12, in a step of acquiring the S-parameters, an incident microwave is first introduced by means of the first microwave introduction module 611. Next, a reflected microwave is measured in the first to seventh microwave introduction modules 611 to 617 and the S-parameters $S_{11}$ to $S_{71}$ are obtained. Next, the steps of introducing the incident microwave to obtaining S-parameters are performed sequentially from the second microwave introduction module 612 to the seventh microwave introduction module 617. The above calculation process can be performed by the process controller 81 of the control unit 8.

Next, after acquiring the S-parameter $S_{ij}$ as described above, $\Delta S_1$ to $\Delta S_6$ are obtained as shown in FIG. 11. Subsequently, $\Delta S_{1max}$ to $\Delta S_{6max}$ are obtained. And then, $\Delta S_{max}$ is obtained. Next, $\Delta S_{max}$ is compared with a predetermined threshold indicating a malfunction in the plurality of microwave introduction modules 61. The above calculation process can be performed by the process controller 81 of the control unit 8. If $\Delta S_{max}$ is smaller than the predetermined threshold, it can be identified that all of the microwave introduction modules 61 are normal. Therefore, the process controller 81 transmits a control signal to cause predetermined plasma processing to be performed in the processing container 2.

On the other hand, if $\Delta S_{max}$ is equal to or larger than the predetermined threshold, a malfunction in the microwave introduction modules 61 is detected. Next, a microwave introduction module 61 in which the malfunction occurs is identified. In this case, the fact of malfunction detection and information on the microwave introduction module 61 in which the malfunction is detected are displayed on the display of the user interface 82 of the control unit 8.

The preceding steps can be automatically performed by the process controller 81 of the control unit 8 based on, for example, a malfunction detection recipe. The microwave introduction module 61 in which the malfunction occurs is replaced with a normal microwave introduction module 61. Next, the malfunction detection method according to this embodiment is carried out again.

As described above, in the S-parameter acquisition method according to this embodiment, an incident microwave is introduced for each of the plurality of microwave introduction modules 61 (611 to 617) and S-parameters $S_{ij}$ for each of combinations of arbitrary two selected from the plurality of microwave introduction modules 61 are obtained based on an incident microwave and a reflected microwave, which is reflected from the processing container 2 into the plurality of microwave introduction modules 61. In addition, in the malfunction detection method according to this embodiment, a difference between the absolute value of the S-parameter $S_{ij}$ of a combination of arbitrary two selected from the plurality of microwave introduction modules 61 and the absolute value of the S-parameter $S_{ij}$ of two microwave introduction modules 61 of a different combination is obtained and the absolute value of the difference is compared with a predetermined threshold indicating the malfunction in the plurality of microwave introduction modules 61. From these points, according to this embodiment, the malfunction in the microwave introduction modules 61 can be detected.

The present disclosure is not limited to the above embodiment but various modifications thereof may be made. For example, the malfunction in the microwave introduction modules 61 may be detected by directly comparing each of $\Delta S_1$ to $\Delta S_6$ as an absolute value of a difference between S-parameters $S_{ij}$ with the predetermined threshold. In addition, depending on a threshold setting method, instead of the absolute values $\Delta S_1$ to $\Delta S_6$ of the difference between S-parameters $S_{ij}$, the difference itself may be compared with the threshold. In addition, the number and arrangement of microwave introduction modules 61 are not limited to the example shown in the above embodiment but may be set arbitrarily as long as they meet the requirements of the claims.

This international application claims the benefit of Japanese Patent Application No. 2012-153902, filed on Jul. 9, 2012, in the Japan Patent Office, the disclosure of which is incorporated herein in its entirety by reference.

What is claimed is:

1. A method for acquiring S-parameters of microwave introduction modules in a plasma processing apparatus including a processing container in which a workpiece is accommodated, a microwave introduction device including a plurality of microwave introduction modules configured to introduce a microwave into the processing container for generating plasma in the processing container, and an exhauster configured to evacuate an interior of the processing container in a pressure reducing manner, the method comprising:

while the plurality of microwave introduction modules is configured to introduce the microwave into different locations in the processing container, putting the interior of the processing container in a vacuum state and a state that no plasma is generated;

obtaining power of the microwave introduced from each of the plurality of microwave introduction modules and powers of reflected microwaves that are reflected into all of the microwave introduction modules, respectively, when introducing the microwave from each of the plurality of microwave introduction modules, by performing operations, with respect to the plurality of microwave introduction modules one by one, of i) introducing the microwave from one of the plurality of microwave introduction modules into the processing container, while not introducing the microwave from the other microwave introduction modules, ii) measuring the power of the microwave introduced from the one microwave introduction module and iii) measuring the powers of reflected microwaves that are reflected from the processing container into all of the microwave introduction modules, respectively, when introducing the microwave from the one microwave introduction module; and obtaining S-parameters for each of combinations of two selected from the plurality of microwave introduction modules based on the powers of the microwave and the reflected microwave.

2. The method of claim 1, wherein each of the plurality of microwave introduction modules includes a power meter configured to measure the power of the microwave and the power of the reflected microwave.

3. The method of claim 1, wherein the microwave includes a plurality of incident waves having different power for each of the plurality of microwave introduction modules, and wherein the reflected microwave includes a plurality of reflected waves corresponding respectively to the plurality of incident waves.

4. The method of claim 3, wherein the S-parameters for each of combinations of two selected from the plurality of microwave introduction modules are obtained from power of the plurality of incident waves and power of the plurality of reflected waves using the least-squares method.

5. The method of claim 1, wherein the microwave introduction device includes first to seventh microwave introduction modules as the plurality of microwave introduction modules, wherein the processing container includes a ceiling portion having first to seventh microwave introduction ports configured to pass the microwave introduced by means of the first to seventh microwave introduction modules into the interior of the processing container, wherein the first microwave introduction port is located in a center of the ceiling portion, and wherein the second to seventh microwave introduction ports are respectively located at vertices of a virtual regular hexagon centered on the first microwave introduction port in the ceiling portion.

6. The method of claim 5, wherein the combinations of two selected from the plurality of microwave introduction modules include a combination of the first microwave introduction module and one of the second to seventh microwave introduction modules.

7. The method of claim 5, wherein the combinations of two selected from the plurality of microwave introduction modules include at least one of a first combination of two microwave introduction modules adjacent to each other along an outer periphery of the virtual regular hexagon, a second combination of two microwave introduction modules every other microwave introduction module along the outer periphery of the virtual regular hexagon, and a third combination of two microwave introduction modules every two microwave introduction modules along the outer periphery of the virtual regular hexagon.

8. The method of claim 5, wherein the combinations of two selected from the plurality of microwave introduction modules cover all combinations of the first to seventh microwave introduction modules.

9. A method for detecting a malfunction in microwave introduction modules in a plasma processing apparatus including a processing container in which a workpiece is accommodated, a microwave introduction device including a plurality of microwave introduction modules configured to introduce a microwave into the processing container for generating plasma in the processing container, and an exhauster configured to evacuate an interior of the processing container in a pressure reducing manner, the method comprising:

while the plurality of microwave introduction modules is configured to introduce the microwave into different locations in the processing container;

obtaining a difference between absolute values of a plurality of S-parameters acquired according to the S-parameter acquisition method of claim 1; and detecting the malfunction based on the difference.

10. The method of claim 9, further comprising comparing an absolute value of the difference with a predetermined threshold indicating a malfunction in the plurality of microwave introduction modules.

11. The method of claim 10, wherein the difference is a plurality of differences obtained through mutual calculation for all of the plurality of acquired S-parameters.

12. The method of claim 11, wherein the maximum value of the absolute value of the plurality of differences is compared with the predetermined threshold.

* * * * *